United States Patent
Shangguan et al.

(10) Patent No.: US 8,092,102 B2
(45) Date of Patent: Jan. 10, 2012

(54) CAMERA MODULE WITH PREMOLDED LENS HOUSING AND METHOD OF MANUFACTURE

(75) Inventors: Dongkai Shangguan, San Jose, CA (US); Samuel Waising Tam, Daly City, CA (US)

(73) Assignee: Flextronics AP LLC, Broomfield, CO (US)

( * ) Notice: Subject to any disclaimer, the term of this patent is extended or adjusted under 35 U.S.C. 154(b) by 141 days.

(21) Appl. No.: 11/444,277

(22) Filed: May 31, 2006

(65) Prior Publication Data
US 2007/0278394 A1 Dec. 6, 2007

(51) Int. Cl.
*G03B 17/00* (2006.01)
(52) U.S. Cl. ......... 396/529; 348/340; 359/819; 257/433
(58) Field of Classification Search .................. 396/529; 348/340; 359/819; 257/433
See application file for complete search history.

(56) References Cited

U.S. PATENT DOCUMENTS

| | | | |
|---|---|---|---|
| 4,894,707 A | 1/1990 | Yamawaki et al. ............. 357/74 |
| 5,976,912 A | 11/1999 | Fukutomi et al. | |
| 6,122,009 A | 9/2000 | Ueda ............................ 348/335 |
| 6,384,397 B1 | 5/2002 | Takiar et al. ............... 250/208.1 |
| 6,414,299 B1 | 7/2002 | Churei | |
| 6,476,417 B2 | 11/2002 | Honda et al. | |
| 6,686,588 B1 * | 2/2004 | Webster et al. ............... 250/239 |
| 6,734,419 B1 | 5/2004 | Glenn et al. .................. 250/239 |
| 6,741,405 B1 | 5/2004 | Chen ............................ 359/813 |
| 6,798,031 B2 | 9/2004 | Honda et al. | |
| 7,009,654 B2 | 3/2006 | Kuno et al. | |
| 7,061,106 B2 | 6/2006 | Yang et al. ..................... 257/723 |
| 7,091,571 B1 * | 8/2006 | Park et al. ...................... 257/432 |
| 7,122,787 B2 | 10/2006 | Nishizawa | |
| 7,199,438 B2 | 4/2007 | Appelt et al. ................. 257/433 |
| 7,579,583 B2 | 8/2009 | Mok et al. | |

(Continued)

FOREIGN PATENT DOCUMENTS

CN 1722453 1/2006

(Continued)

OTHER PUBLICATIONS

PCT Application No. PCT/US2007/013014, International Search Report and Written Opinion dated Aug. 27, 2008.

(Continued)

*Primary Examiner* — W. B. Perkey
*Assistant Examiner* — Fang-Chi Chang
(74) *Attorney, Agent, or Firm* — Henneman & Associates, PLC; Larry E. Henneman, Jr.

(57) ABSTRACT

A novel digital camera module includes an image capture device, a circuit substrate, a lens unit and a housing that is mounted to the circuit substrate before the image capture device is mounted to the circuit substrate. In one particular embodiment, the housing is formed onto the circuit substrate via molding. The housing includes a bore to receive the lens unit, with the diameter of the bore being larger than the diagonal of the image capture device such that image capture device can be mounted to the circuit substrate through the bore. In another particular embodiment, the circuit substrate includes an aperture so as to facilitate the flip-chip bonding of the image capture device. The order in which the image capture device and the housing are coupled to the circuit substrate helps prevent damage to the image capture device during the mounting of the housing to the circuit substrate.

11 Claims, 8 Drawing Sheets

U.S. PATENT DOCUMENTS

| | | | |
|---|---|---|---|
| 7,583,309 | B2 | 9/2009 | Aizawa et al. |
| 7,679,669 | B2 | 3/2010 | Kwak |
| 2002/0145676 | A1 | 10/2002 | Kuno et al. |
| 2002/0167605 | A1 | 11/2002 | Akimoto et al. |
| 2002/0191103 | A1 | 12/2002 | Akimoto et al. ............... 348/374 |
| 2003/0071342 | A1 | 4/2003 | Honda et al. .................. 257/687 |
| 2003/0137595 | A1 | 7/2003 | Takachi |
| 2003/0146998 | A1 | 8/2003 | Doering et al. |
| 2003/0214021 | A1 | 11/2003 | Zhou et al. |
| 2004/0012698 | A1 | 1/2004 | Suda et al. |
| 2004/0027687 | A1 | 2/2004 | Bittner et al. |
| 2004/0109079 | A1 | 6/2004 | Fujimoto et al. |
| 2004/0189853 | A1 | 9/2004 | Takeuchi et al. ............... 348/340 |
| 2005/0046740 | A1 | 3/2005 | Davis ........................... 348/373 |
| 2005/0185088 | A1* | 8/2005 | Kale et al. ..................... 348/374 |
| 2005/0212947 | A1 | 9/2005 | Sato et al. |
| 2005/0274883 | A1* | 12/2005 | Nagano ......................... 250/239 |
| 2005/0285016 | A1 | 12/2005 | Kong et al. |
| 2006/0006486 | A1* | 1/2006 | Seo et al. ...................... 257/433 |
| 2006/0028573 | A1 | 2/2006 | Seo et al. ...................... 348/340 |
| 2006/0044450 | A1 | 3/2006 | Wolterink et al. ............ 348/340 |
| 2006/0132644 | A1* | 6/2006 | Shangguan et al. .......... 348/374 |
| 2007/0058069 | A1* | 3/2007 | Chen et al. .................... 348/340 |

FOREIGN PATENT DOCUMENTS

| | | |
|---|---|---|
| EP | 0 813 236 | 12/1997 |
| EP | 0813236 | 12/1997 |
| EP | 1429168 | 6/2004 |
| EP | 1434426 A2 | 6/2004 |
| EP | 1445803 A2 | 8/2004 |
| JP | 2001-292365 | 10/2001 |
| JP | 2001292365 | 10/2001 |
| JP | 2002252796 | 9/2002 |
| JP | 2003078077 | 3/2003 |
| JP | 2003131112 | 5/2003 |
| JP | 2003219284 A | 7/2003 |
| WO | WO 2004/027880 | 4/2004 |

OTHER PUBLICATIONS

PCT Application No. PCT/US2007/013014, International Preliminary Report on Patentability dated Dec. 18, 2009.
CN Application No. 200780026542.4, Office Action dated Nov. 13, 2009 (English translation).
U.S. Appl. No. 10/784,102, Information Disclosure Statement dated Mar. 27, 2006.
U.S. Appl. No. 10/784,102, Office Action dated Nov. 24, 2006.
U.S. Appl. No. 10/784,102, Office Action dated Jul. 30, 2007.
U.S. Appl. No. 10/784,102, Information Disclosure Statement dated Oct. 30, 2007.
U.S. Appl. No. 10/784,102, Interview Summary dated Nov. 15, 2007.
U.S. Appl. No. 10/784,102, Office Action dated Dec. 5, 2007.
U.S. Appl. No. 10/784,102, Interview Summary dated May 20, 2008.
U.S. Appl. No. 10/784,102, Office Action dated Sep. 3, 2008.
U.S. Appl. No. 10/784,102, Information Disclosure Statement dated Feb. 27, 2009.
U.S. Appl. No. 10/784,102, Office Action dated Mar. 17, 2009.
U.S. Appl. No. 10/784,102, Office Action dated Jan. 19, 2010.
U.S. Appl. No. 10/784,102, Interview Summary dated Apr. 9, 2010.
PCT Application No. PCT/US2005/005139, International Search Report and Written Opinion dated Jun. 12, 2007.
PCT Application No. PCT/US2005/005139, International Preliminary Report on Patentability dated Jul. 10, 2007.
CN Application No. 20058008990.2, Office Action dated Aug. 1, 2008.
CN Application No. 20058008990.2, Office Action dated Jun. 12, 2009.
EP Application No. 05 713 765.5, Supplementary European Search Report dated Dec. 5, 2008.
EP Application No. 05 713 765.5, Office Action dated Mar. 17, 2009.
JP Application No. 2006-554218, Office Action dated Dec. 9, 2009.
U.S. Appl. No. 11/247,993, Information Disclosure Statement dated Mar. 27, 2006.
U.S. Appl. No. 11/247,993, Office Action dated Dec. 26, 2008.
U.S. Appl. No. 11/247,993, Office Action dated Sep. 10, 2009.
U.S. Appl. No. 11/247,993, Office Action dated Jan. 6, 2010.
U.S. Appl. No. 11/247,993, Information Disclosure Statement dated Apr. 8, 2010.
U.S. Appl. No. 11/247,993, Notice of Allowance dated May 4, 2010.
PCT Application No. PCT/US2006/039521, International Search Report and Written Opinion dated Aug. 2, 2007.
PCT Application No. PCT/US2006/039521, International Preliminary Report on Patentability dated Apr. 24, 2008.
CN Application No. 200680046525.2, Office Action dated Jul. 10, 2009.
CN Application No. 200680046525.2, Office Action dated Mar. 25, 2010.
EP Application No. 06 816 608.1, European Search Report dated Mar. 10, 2010.
U.S. Appl. No. 10/784,102, Notice of Allowance dated Jun. 10, 2010.
U.S. Appl. No. 10/784,102, Office Communication dated Jul. 30, 2010.
U.S. Appl. No. 10/784,102, Notice of Allowance dated Sep. 28, 2010.
CN Application No. 200910170632.1, Office Action dated Jan. 17, 2011 (English trans).
EP Application No. 05 713 765.5, Office Action dated Feb. 25, 2010.
EP Application No. 10 177 430.5, Supplementary ESR dated Nov. 15, 2010.
JP Application No. 2006-554218, Office Action dated Jul. 28, 2010.
TW Application No. 095135550, Office Action dated Mar. 25, 2010 (English trans).

* cited by examiner

CAMERA MODULE WITH PREMOLDED LENS HOUSING AND METHOD OF MANUFACTURE

BACKGROUND OF THE INVENTION

1. Field of the Invention

The present invention relates generally to digital cameras, and more particularly to digital camera modules that can be mounted in host electronic devices. Even more particularly, the present invention relates to a process for manufacturing a digital camera module that substantially reduces potential damage to an image capture device during the manufacturing the digital camera or digital camera module.

2. Description of the Background Art

Digital camera modules are currently being incorporated into a variety of electronic devices. Such camera hosting devices include, but are not limited to, cellular telephones, personal digital assistants (PDAs), and computer cams. The demand for digital camera modules continues to grow as the ability to incorporate the camera modules into host devices expands. Therefore, one design goal of digital camera modules is to make them as small as possible so that they will fit into an electronic device without substantially increasing the overall size of the device. Furthermore, it is also desirable to manufacture such digital camera modules as efficiently and robustly as possible. Means for achieving these design goals must, of course, preserve the quality of the image captured by the camera modules.

Typically, digital camera modules include a lens unit, a housing, a circuit substrate, and a solid-state image capture device. Upon assembly, the image capture device is electrically connected to the circuit substrate via a plurality of wire bonds or the like. The circuit substrate is then fixed to the bottom of the housing or the housing is mounted on the circuit substrate. Typically, housings of this type are fabricated (e.g., by injection molding) separately before they are coupled to circuit substrates. After the housing is formed, it is fixed to the circuit substrate by some suitable means such as an adhesive, thermal weld, post/aperture engagement, etc. The lens unit is then adjustably mounted to the opposite end of the housing so that images can be focused onto the image capture device.

The image capture devices are very sensitive, which is a disadvantage in terms of manufacturing time, cost, quality, and yield of the camera module. The image capture device is extremely vulnerable to damage and contamination, particularly before and during the housing attach process. For example, before the housing is attached to the circuit substrate, the wire bonds are exposed to inadvertent contact (e.g., during handling), which can cause damage. Further, the image capture device is vulnerable to contamination from particulate debris caused by the housing attach process. Contamination of the sensor array will block light and cause visible artifacts in every image captured by the device. Obviously, damaged image capture devices causes a decrease in product yield and an increase in labor and material costs.

What is needed therefore, is a method for manufacturing camera modules that reduces the chance of damaging the image capture devices. What is also needed is a method for manufacturing camera modules that results in a higher yield. What is also needed is a method for manufacturing camera modules that results in a faster manufacturing throughput. What is also needed is a less expensive method for manufacturing camera modules.

SUMMARY

The present invention overcomes the problems associated with the prior art by providing a digital camera module and a method of manufacturing the camera module, wherein the housing is mounted to the circuit substrate before the image capture device is mounted to the circuit substrate. Mounting the housing onto the circuit substrate before mounting the image capture device onto the circuit substrate prevents the image capture device from being damaged during the housing attachment process. In addition, having the housing attached to the circuit substrate provides a more robust substrate to mount the image capture device on.

The digital camera module includes a circuit substrate, a lens housing mounted on the circuit substrate and an image capture device that is mounted on the circuit substrate. The structure and/or location of the lens housing allows the image capture device to be attached after the housing is mounted on the circuit substrate. In one particular embodiment, the housing is formed on the circuit substrate via a molding process. Alternatively, the housing is formed separately and attached to the circuit substrate as a component part.

In one embodiment, the structure of the housing facilitates the later mounting of the image capture device. The housing includes a bore with a diameter that is larger than a diagonal of the image capture device, so the image capture device can be mounted through the bore. In another embodiment, the position of the housing facilitates the later mounting of the image capture device. The housing is fixed to one surface (e.g., the top) of the circuit substrate and the image capture device is mounted to the opposite surface (e.g., the bottom) of the circuit substrate. In this embodiment, the circuit substrate defines an aperture and the image capture device is mounted so that light passing through the aperture impinges on a light sensitive portion of the image capture device.

A method of manufacturing a camera module is also described. The method includes the steps of providing an image capture device, providing a circuit substrate, mounting a housing on the circuit substrate, and mounting the image capture device on the circuit substrate after the housing is mounted on the circuit substrate. In a particular method, the housing is molded directly on the circuit substrate. Alternatively, the housing is preformed before it is mounted to the circuit substrate.

In another particular method, the image capture device is flip-chip mounted. This particular method includes mounting the housing on a first surface (e.g., top) of the circuit substrate and mounting the image capture device on an opposite (e.g., bottom) surface of the circuit substrate. The image capture device is mounted so that a light sensitive portion of the image capture device faces through an aperture in the circuit substrate.

In another particular method, image capture device is mounted through an opening in the housing. For example, the image capture device can be mounted through a bore in the housing that is adapted to receive a lens unit.

BRIEF DESCRIPTION OF THE DRAWINGS

The present invention is described with reference to the following drawings, wherein like reference numbers denote substantially similar elements.

DETAILED DESCRIPTION

The present invention overcomes the problems associated with the prior art, by providing a system and method for manufacturing a digital camera module, wherein a housing adapted to hold a lens unit is mounted on a substrate prior to mounting an image capture device on the substrate. In the following description, numerous specific details are set forth (e.g., example lens housing structure, etc.) in order to provide a thorough understanding of the invention. Those skilled in the art will recognize, however, that the invention may be practiced apart from these specific details. In other instances, details of well known camera module manufacturing practices (e.g., assembly, circuit fabrication, molding processes, focusing means, etc.) and components have been omitted, so as not to unnecessarily obscure the present invention.

Figure 1:
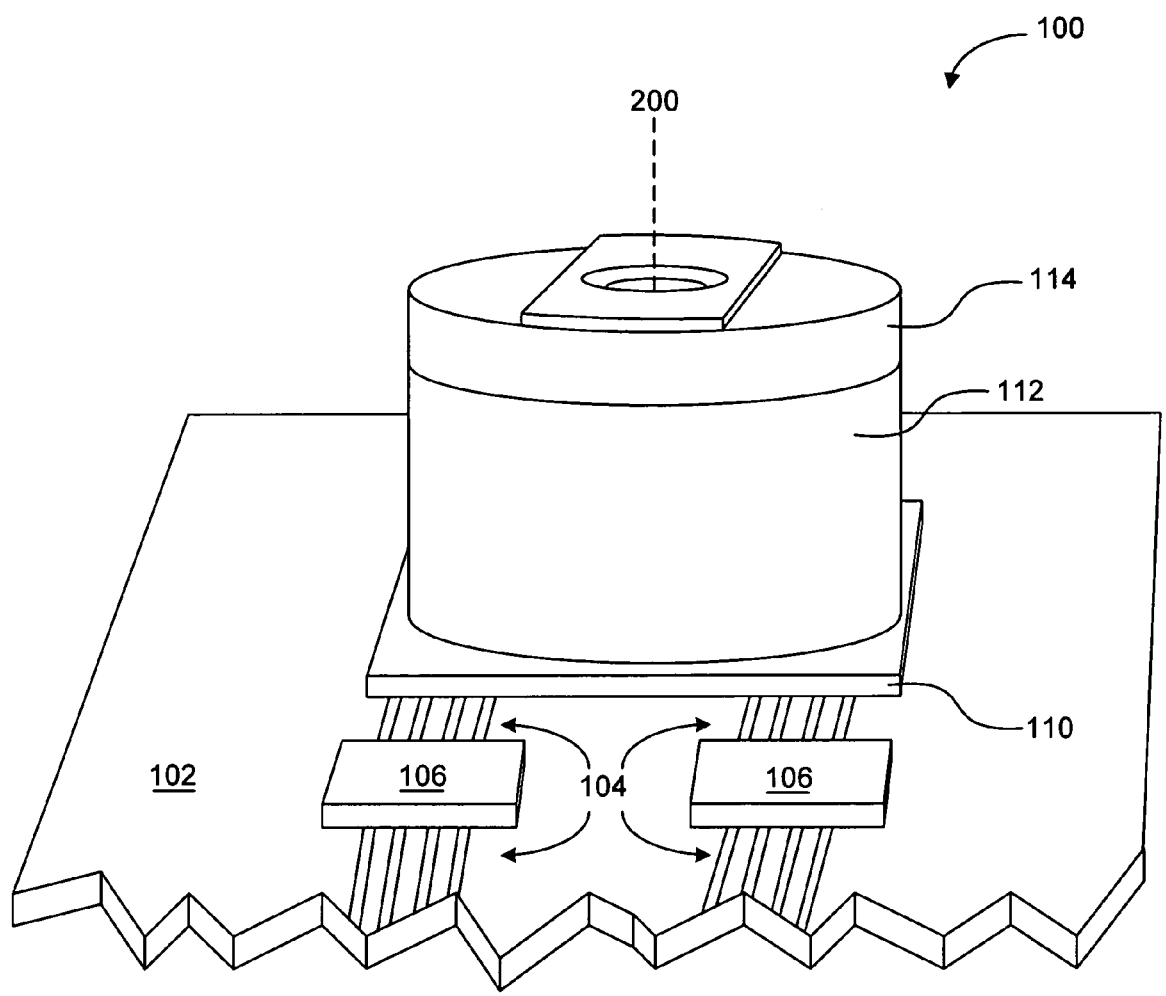
FIG. 1 is a perspective view of a camera module fixed to a host printed circuit board.

FIG. 1 is a perspective view of a camera module 100 according to one embodiment of the present invention. Camera module 100 is shown mounted on a circuit substrate, in this particular example a portion of a printed circuit board (PCB) 102 that represents a PCB of a host device (remainder of host device not shown), and communicates electronically with other components of the host device via a plurality of electronic traces 104. Devices 106 represent electronic components (e.g., passive devices, etc.) that are mounted on PCB 102. Those skilled in the art will recognize that the particular design of PCB 102 will depend on the particular application (e.g., cell phone, PDA, etc.), and is not particularly relevant to the present invention. Therefore, PCB 102, traces 104, and devices 106 are representational in character only.

Camera module 100 includes an image capture device 108 (not visible in the view of FIG. 1), a circuit substrate 110, a housing 112, and a lens unit 114. Camera module 100 is mounted on PCB 102 via electrical contacts (not visible) on the bottom of circuit substrate 110, which make electrical contact with traces 104. Image capture device 108 is mounted on the top of circuit substrate 110 within housing 112. In this particular embodiment, housing 112 defines a cylindrical wall that extends upwardly from circuit substrate 110 and defines an opening for receiving and supporting lens unit 114. Lens unit 114 is disposed within the top opening of housing 112, and is adjustably mounted therein by some suitable means (e.g., threads, ramps, etc.) so as to focus an image onto image capture device 108. The focusing means is not shown in detail, because it is not particularly relevant to the present invention.

Figure 2:
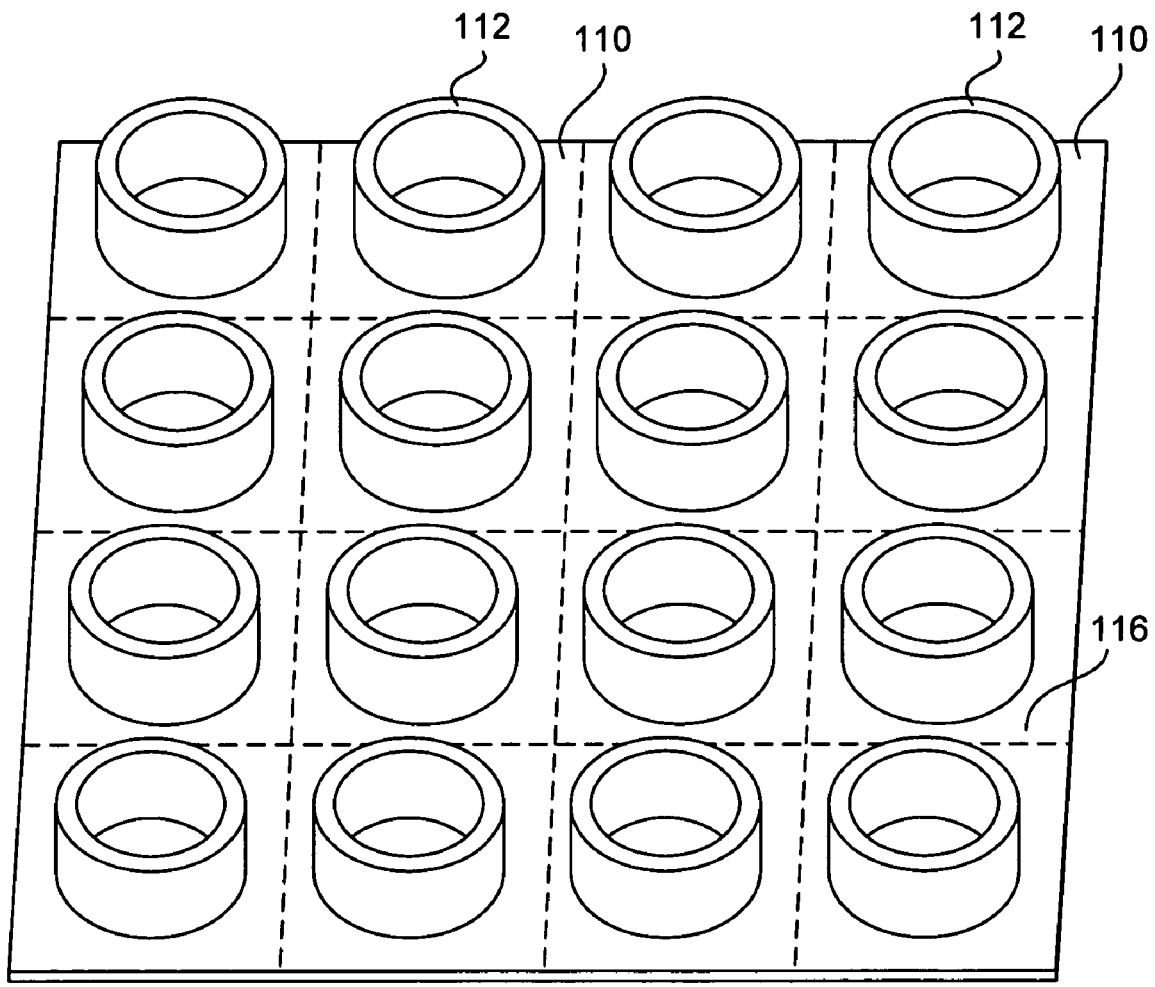
FIG. 2 is a perspective view of an array of lens housings formed on a circuit substrate sheet.

FIG. 2 shows a perspective view of an array of housings 112 (16 in this example) formed on a circuit substrate sheet 116. In this particular embodiment, housings 112 are all formed at the same time directly onto unitary circuit substrate sheet 116 via a molding process. Optionally, housings 112 can be pre-fabricated and attached to circuit substrate sheet 116 via an adhesive or any other suitable means. In either case, the housing should be formed from a material (e.g., a thermosetting resin) that can withstand the subsequent process (e.g., soldering, wirebonding, etc.) for attaching image capture device 108 to circuit substrate 110.

As shown in FIG. 2, substrate sheet 116 includes a plurality of individual camera module circuit substrates 110, each with a respective one of housings 112 attached thereto. The individual circuit substrates 110 can be separated by some suitable means (e.g., sawing, scoring, etc.) either before or after the image capture devices 108 are mounted thereon. However, assembling camera modules 100 prior to dividing substrate sheet 116 provides certain advantages including, but not limited to, reduced manufacturing time and protecting image capture devices 108 (FIG. 3) from debris generated by the separation process. Note that the array dimensions (e.g., 4×4 array of housings) are not particularly relevant to the present invention. For example, the array could include a single strip of housings in a row or any other convenient layout.

Figure 3:
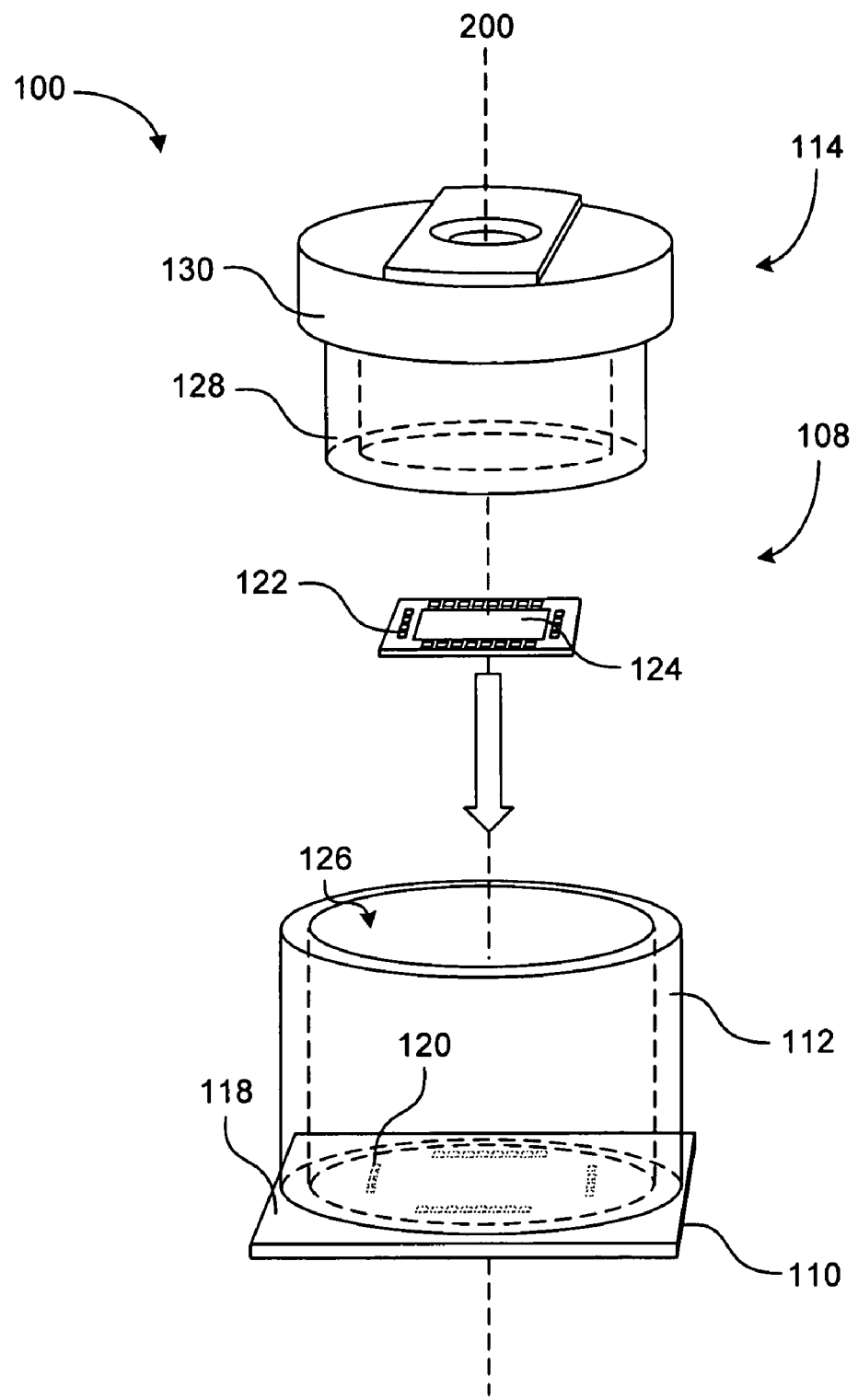
FIG. 3 is an exploded view of the camera module of FIG. 1.

FIG. 3 is an exploded view of a representative one of camera modules 100, which are assembled on substrate sheet 116. Although, conventional camera modules are manufactured by coupling image capture device 108 to circuit substrate 110 before the housing attach process, camera module 100 is assembled by attaching image capture devices 108 to circuit substrate 110 after housings 112 are formed on circuit substrate sheet 116. This method is particularly advantageous, because it minimizes the risks of damaging or contaminating image capture devices 108 during the process of attaching housing 112 to circuit substrate 110. As used herein, the term attaching is understood to include and means of joining housing 112 with substrate 110, including, but not limited to, forming or molding housing 112 directly on circuit substrate 110 and attaching a preformed housing 112 to circuit substrate 110.

In this particular embodiment, each image capture device 108 (FIG. 3) is mounted through the central opening of one of housings 112, mechanically fixed (e.g., by an adhesive) to the associated circuit substrate 110, and electrically coupled to the circuitry of circuit substrate 110. Circuit substrate 110 includes a top surface 118 whereon a plurality of electrical contacts 120 are formed. Contacts 120 facilitate the electrical connection between image capture device 108 and the circuitry of circuit substrate 110. Image capture device 108 includes a corresponding set of electrical contacts 122 that are electrically coupled to contacts 120 by some suitable means (e.g., wire bonding shown in FIG. 4).

It should be noted that contacts 122 need not be formed on the upper surface of image capture device 108 in order to provide for a sufficient electrical connection to circuit substrate 110. For example, image capture device 108 can include a plurality of contacts formed on it's rear surface such that image capture device 108 can be electrically coupled to corresponding contacts 122 of circuit substrate 110 via a solder process, thereby mechanically and electrically coupling image capture device 108 to circuit substrate 112 in a single process.

Image capture device 108 further includes an image capture surface 124 on which images are focused by lens unit 114. What ever particular process is used, image capture device 108 should be mounted so that surface 124 remains substantially perpendicular to optical axis 200, so that surface 124 will lie in the focal plane of lens unit 114.

After image capture device 108 is attached, a lens unit 114 is positioned in each housing 112. The position of lens unit 114 within housing 112 is adjustable to facilitate the focusing of lens unit 114 with respect to image capture device 108. Housing 112 defines a bore 126 that accepts lens barrel 128 of lens unit 114 and facilitates the rotation of lens unit 114 about optical axis 200. Various mechanical adjustment means are known in the art that convert the rotational motion of lens unit 114 into translational motion along optical axis 200. However, no particular adjustment mechanism is shown, because the details of the adjustment mechanism, or even the inclusion of a focus mechanism, are not particularly relevant to the present invention. Lens unit 114 further includes a flange 130 that limits the vertical displacement of lens unit 114 with respect to housing 112 so that lens unit cannot contact and damage image capture device 108.

Figure 4:
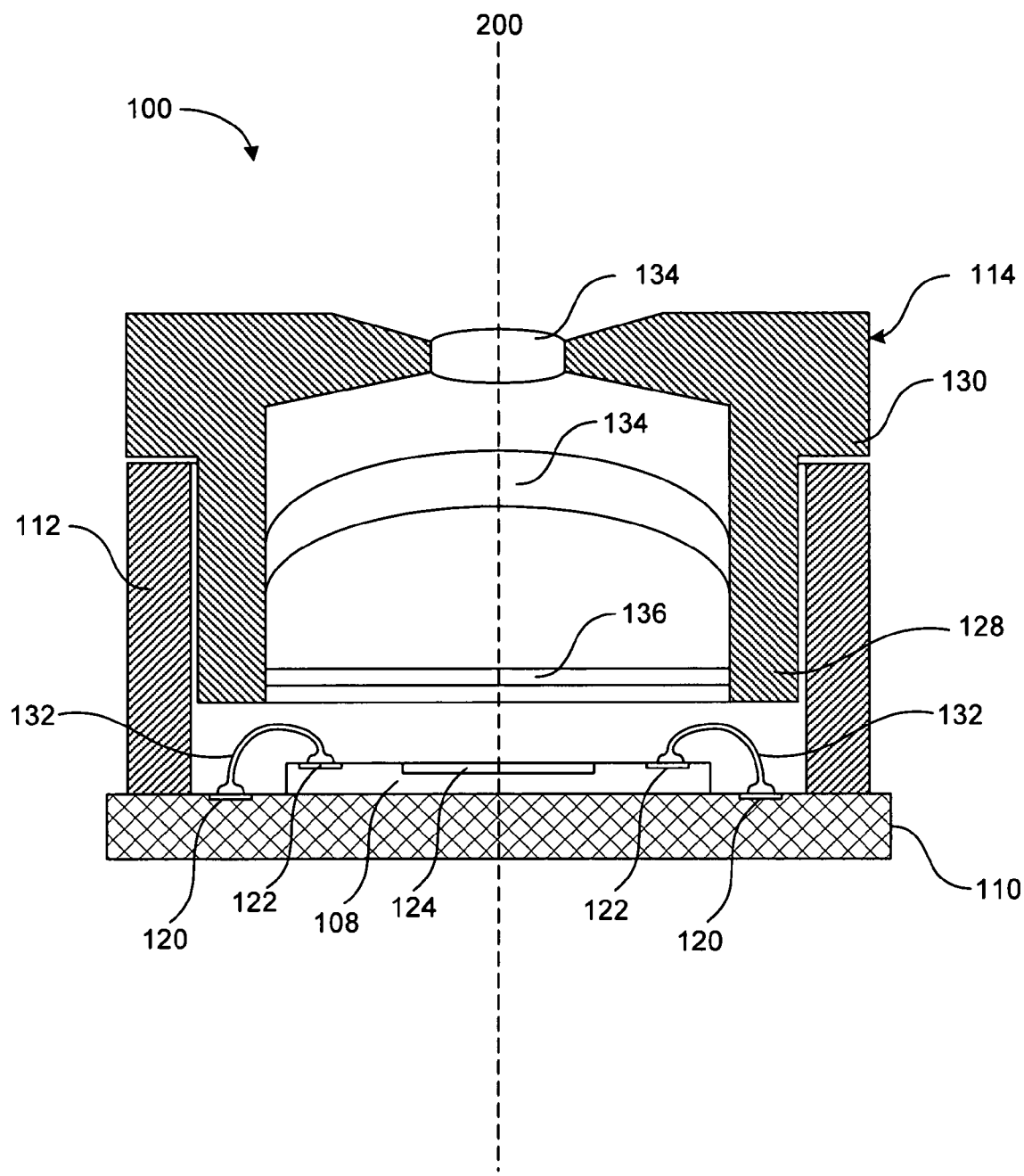
FIG. 4 is a cross-sectional view of the camera module of FIG. 1.

FIG. 4 shows a cross-sectional view of fully assembled camera module 100. Contacts 120 of circuit substrate 110 are electrically coupled to corresponding contacts 122 of image capture device 108 via a plurality of wire bonds 132. Lens unit 114 is shown to include a plurality of lenses 134 and an optical filter 136 (e.g., an infrared filter). The details of lens unit 114 and the particular optical elements contained therein are not particularly relevant to the present invention.

Figure 5:
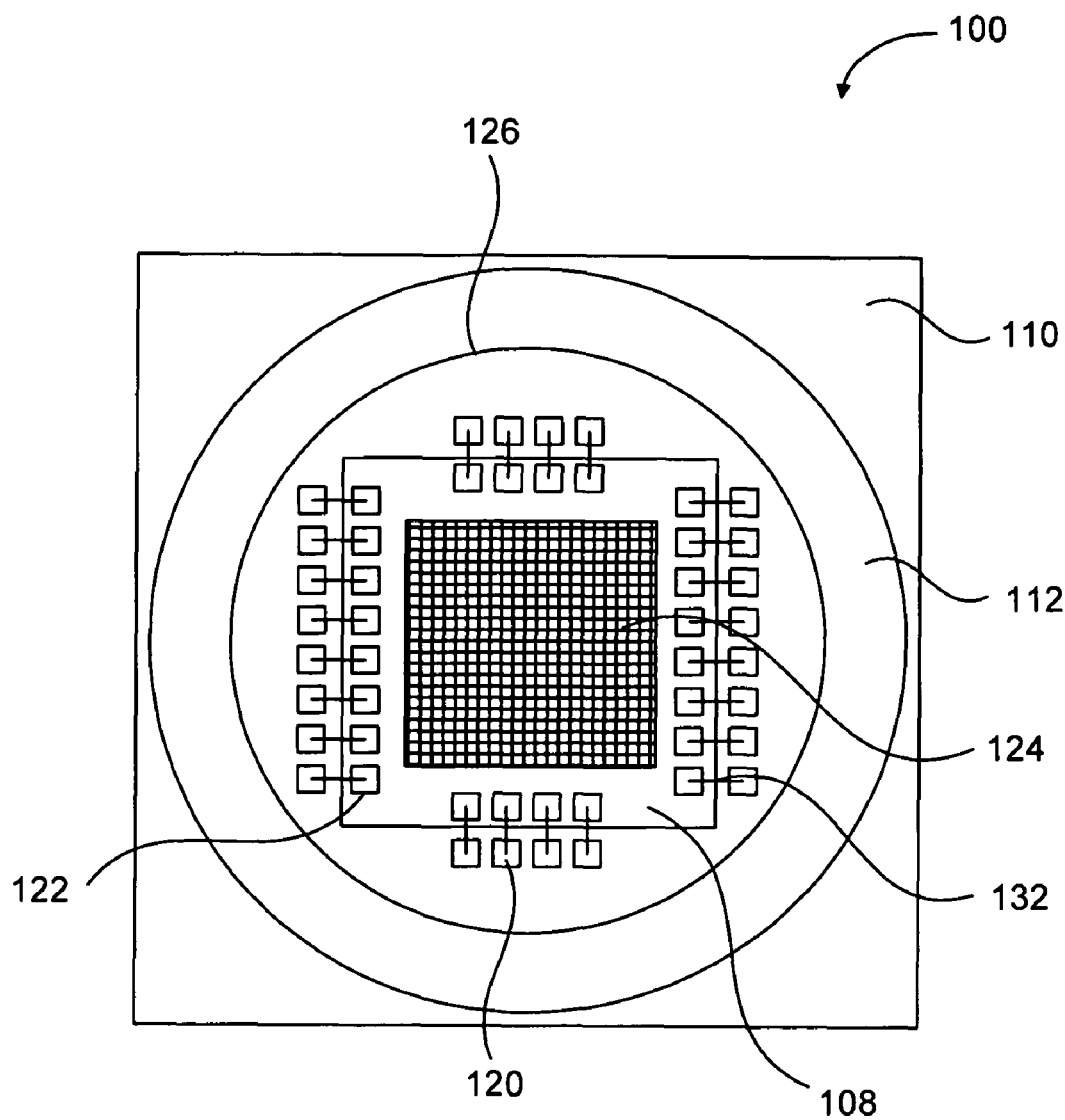
FIG. 5 is a top view of a portion the camera module of FIG. 1.

FIG. 5 is a top view of camera module 100 with lens unit 114 removed. Note that the diameter of bore 126 is greater than the diagonal of image capture device 108 so that image capture device 108 can be mounted to circuit substrate 110 after housing 114 is formed thereon. Optionally, the diameter of bore 126 can be nearly the same size as the diagonal of image capture device 108 to provide an easy means for positioning image capture 108.

Figure 6:
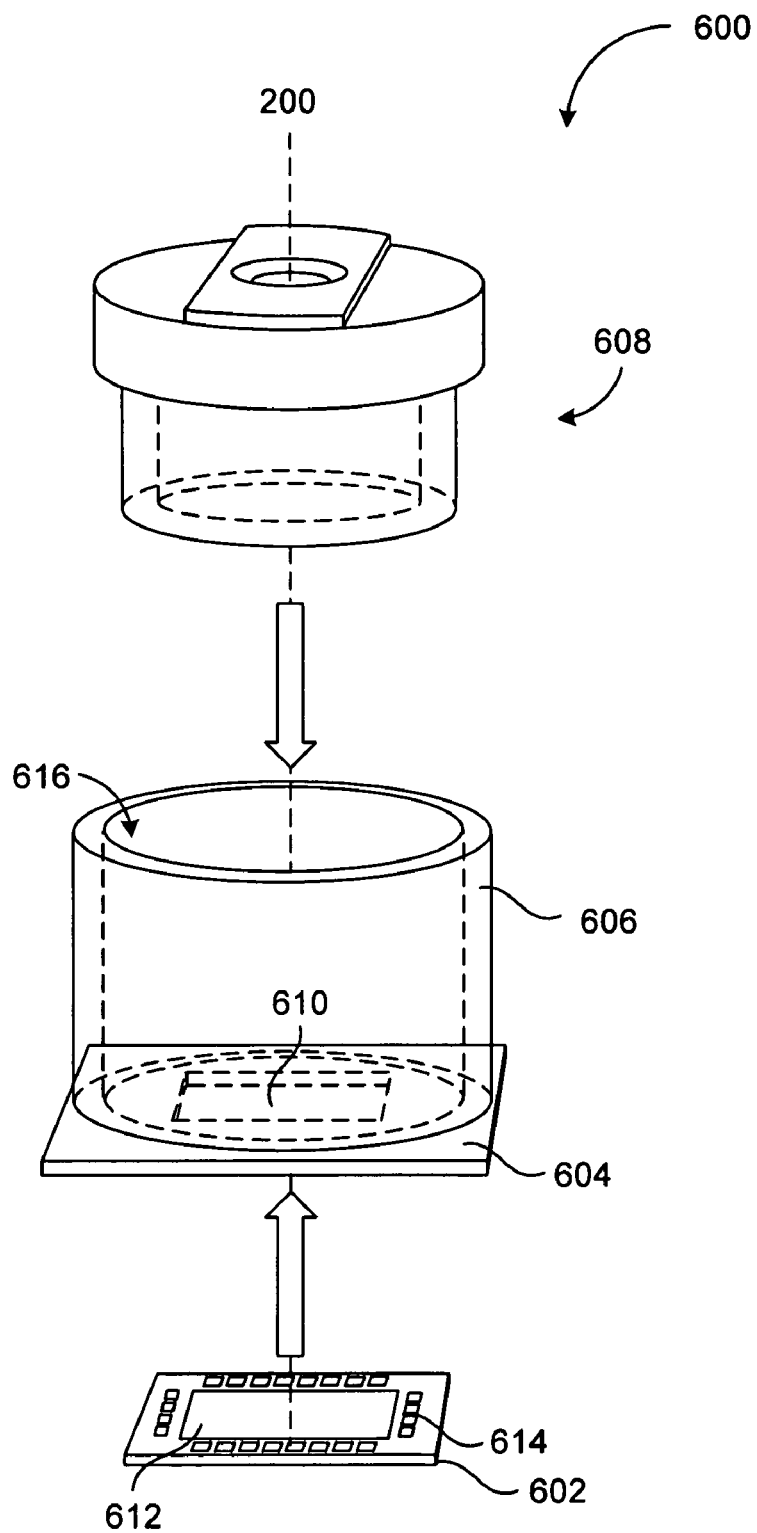
FIG. 6 is an exploded view of an alternate camera module.

FIG. 6. is an exploded view of an alternative camera module 600 including an image capture device 602, a circuit substrate 604, a housing 606, and a lens unit 608. In this particular embodiment, circuit substrate 604 includes an aperture 610 that allows light to travel through a portion of circuit substrate 604. Aperture 610 is large enough to allow lens unit 608 to focus an image onto image capture surface 612 of image capture device 602, through aperture 610.

In this embodiment, image capture device 602 is flip-chip bonded to the bottom surface of substrate 604 after housing 606 is formed/mounted on substrate 604. In this flip-chip bonding method, electrical contacts 614 of image capture device 602 are bonded to electrical contacts (not shown) on the bottom surface of circuit substrate 604. Except as explained below, the structure and assembly of housing 606 and lens unit 608 are substantially the same as housing 112 and lens unit 114, respectively, as described above.

Mounting image capture device 602 to the bottom surface of circuit substrate 604 provides several advantages. For example, because image capture device 602 is not mounted through bore 616 (as in camera module 100), housing 606 and lens unit 608 can be significantly smaller. Note that the diameter of bore 616 is only slightly larger than aperture 610, which is about the same size as image capture surface 612. Thus, the overall footprint of camera module 600 is significantly reduced. Another advantage is that even though housing 606 is attached to circuit substrate 604 prior to attaching image capture device 602, housing 606 does not get in the way when attaching image capture device 602. In fact, housing 606 provides extra support for circuit substrate 604 during the attachment of image capture device 602, thereby making the attachment process more efficient and more reliable.

Figure 7:
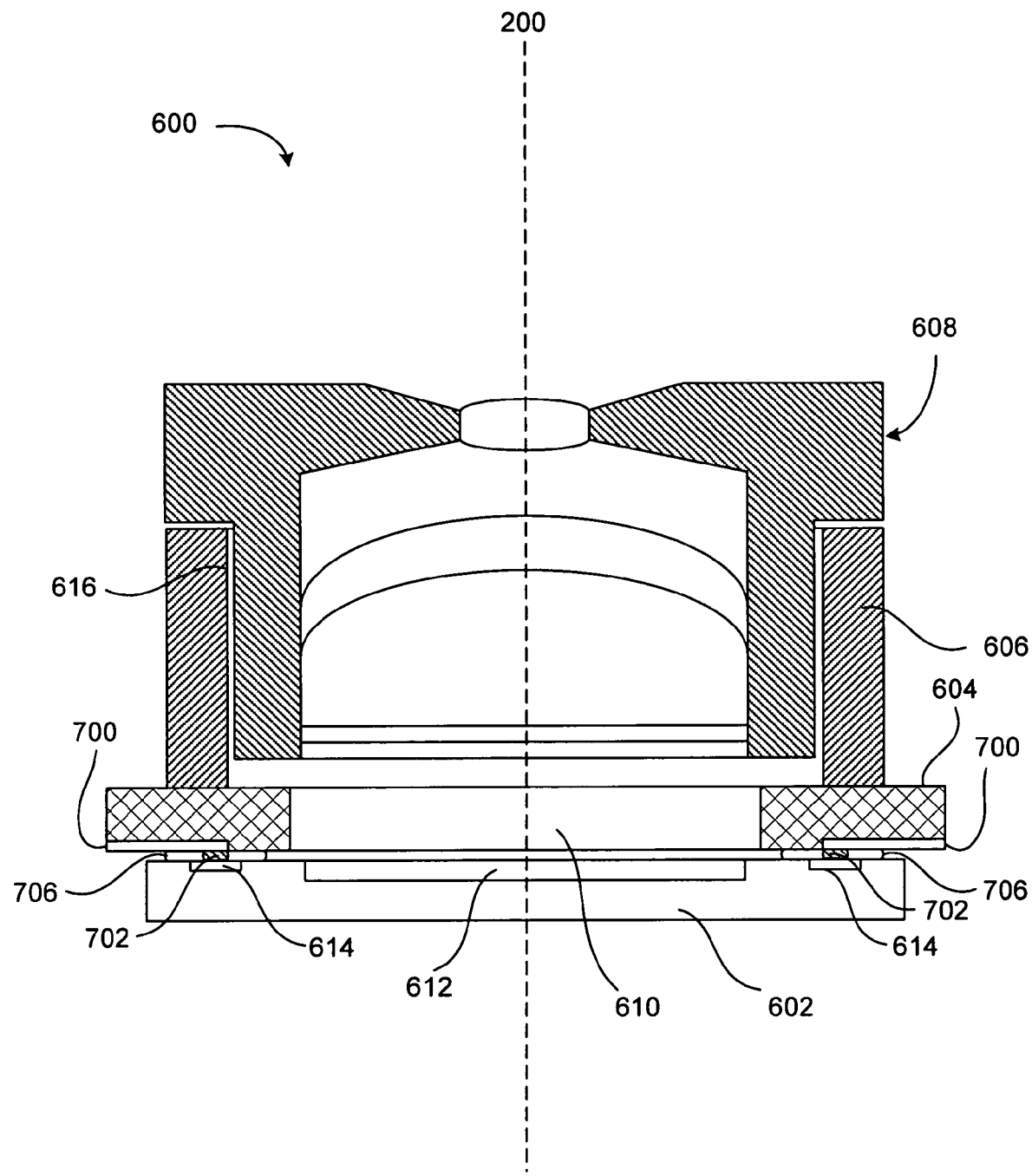
FIG. 7 is a cross-sectional view of the alternate camera module of FIG. 6.

FIG. 7 shows a cross-sectional side view of camera module 600. In this particular embodiment, circuit substrate 604 includes a plurality of conductive traces 700 formed on the rear surface. Traces 700 provide contacts for electrically connecting image capture device 602 to circuit substrate 604 and also for electrically connecting circuit substrate 604, and thus image capture device 602, to another device such as host device PCB (FIG. 1).

The connections between contacts 614 of image capture device 602 and traces 700 of circuit substrate 604 are made by gold-stud-bump, thermocompression bonding. A plurality of bumps 702 (e.g., au stud bumps) are formed on contacts 614. Image capture device 602 is then positioned on circuit substrate 604 so that the gold bumps 702 contact traces 700. Then, bonded connections are formed between gold bumps 702 and traces 700 and contacts 614 by applying heat and pressure. Optionally, nonconductive paste (NCP) 706 can be applied between image capture device 602 and circuit substrate 604 as part of the bonding process to further strengthen the bonded connections.

Note that the drawing of FIG. 7 is not to scale. For example, the relative sizes of the features are not accurately shown. Instead, certain features are exaggerated to show the detailed structure thereof.

Figure 8:
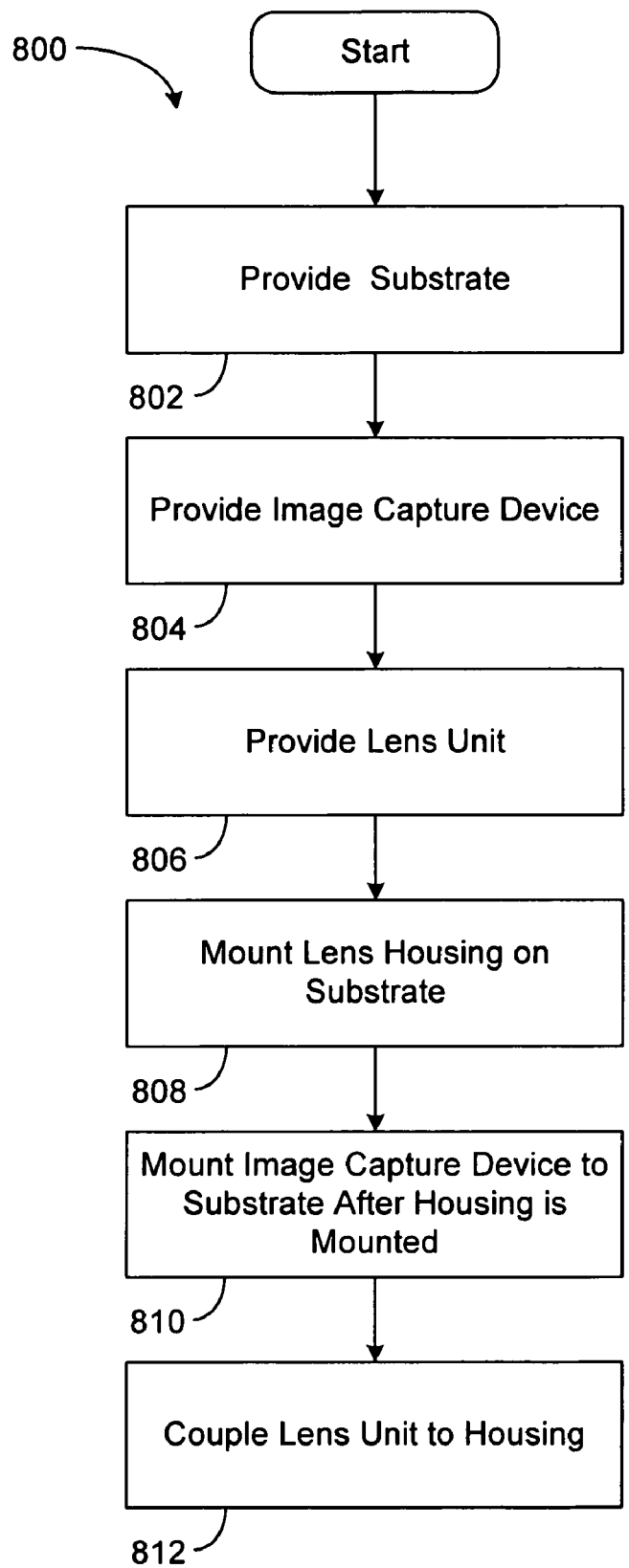
FIG. 8 is a flow chart summarizing a method for manufacturing camera modules.

FIG. 8 is a flow chart summarizing one method for manufacturing a camera module according to the present invention. In a first step 802, a circuit substrate is provided. Next, in a second step 804, an image capture device is provided. Then, in a third step 806, a lens unit is provided. Next, in a fourth step 808, a lens housing is mounted on the circuit substrate. As used herein the term "mount" includes, but is not limited to, forming a housing directly on the circuit substrate (e.g., via a molding process) as well as attaching a preformed housing. Then, in a fourth step 810, the image capture device is mounted to the circuit substrate after the housing has been mounted. Finally, in a fifth step 812, the lens unit is coupled to the housing.

The description of particular embodiments of the present invention is now complete. Many of the described features may be substituted, altered or omitted without departing from the scope of the invention. For example, alternate lens units and housings, may be substituted for the lens units and housings shown. As another example, other processes (e.g., thermosonic bonding) can be used to mount the imagers to the circuit substrates. These and other deviations from the particular embodiments shown will be apparent to those skilled in the art, particularly in view of the foregoing disclosure.

We claim:

1. A digital camera module comprising:
   a pre-fabricated circuit substrate;
   a lens housing formed on said pre-fabricated circuit substrate; and
   an image capture device coupled to said circuit substrate; and wherein
   said lens housing allows said image capture device to be mounted to said circuit substrate after said lens housing is formed on said circuit substrate;
   said lens housing defines a bore adapted to receive a lens unit; and
   a diameter of said bore is sized with respect to a longest diagonal of said image capture device such that said bore facilitates lateral positioning of said image capture device on said circuit substrate.

2. The digital camera module according to claim 1, wherein:
   said circuit substrate includes a substantially flat top surface; and
   said image capture device and said lens housing are affixed to said substantially flat top surface.

3. The digital camera module according to claim 1, wherein said diameter of said bore is nearly the same size as said longest diagonal of said image capture device.

4. A method for manufacturing a camera module comprising:
   providing an image capture device;
   providing a pre-fabricated circuit substrate;
   forming a lens housing on said pre-fabricated circuit substrate; and
   mounting said image capture device onto said circuit substrate after said lens housing is formed on said circuit substrate; and wherein said step of mounting said image capture device onto said circuit substrate includes mounting said image capture device through a bore in said lens housing, said bore adapted to receive a lens unit; and a diameter of said bore is sized with respect to a longest diagonal of said image capture device such that said step of mounting said image capture device includes using said bore to laterally position said image capture device on said circuit substrate.

5. The method for manufacturing a camera module according to claim 4, wherein said step of providing a circuit substrate includes providing a circuit substrate having at least one insulating layer and at least one conductive layer.

6. The method for manufacturing a camera module according to claim 5, wherein:

said step of forming said lens housing on said circuit substrate includes molding said lens housing onto said insulating layer such that said lens housing is disposed a spaced distance from at least one electrical contact of said conductive layer; and said step of mounting said image capture device onto said circuit substrate includes coupling said image capture device to said at least one electrical contact of said conductive layer.

7. The method for manufacturing a camera module according to claim 4, wherein:

said circuit substrate is made of a first material; and said lens housing is formed from a second material different from said first material.

8. The method for manufacturing a camera module according to claim 4, wherein:

said circuit substrate includes a substantially flat top surface; and said image capture device and said lens housing are affixed to said substantially flat top surface.

9. A method for manufacturing camera modules comprising:

providing a pre-fabricated circuit substrate having a plurality of individual camera module circuit boards embodied therein;

forming a plurality of housings on said pre-fabricated circuit substrate, each of said housings formed on an associated one of said individual camera module circuit boards;

providing a plurality of image capture devices; and mounting a respective one of said image capture devices onto each of said individual camera module circuit boards, each of said image capture devices being mounted on an associated one of said camera module circuit boards after one of said housings is formed on said associated camera module circuit board; and wherein said step of mounting said respective one of said image capture devices onto each of said individual camera module circuit boards includes mounting said respective one of said image capture devices through a bore in said housing, said bore adapted to receive a lens unit; and a diameter of said bore is sized with respect to a longest diagonal of said respective one of said image capture devices such that said step of mounting said respective one of said image capture devices includes using said bore to laterally position said respective one of said image capture device on said associated one of said camera module circuit boards.

10. The method for manufacturing camera modules according to claim 9, wherein each of said individual camera module circuit boards include at least one insulating layer and at least one conductive layer.

11. The method for manufacturing camera modules according to claim 10, wherein:

said step of forming said plurality of housings on said circuit substrate includes molding each of said housings onto said insulating layer of said respective one of said individual camera module circuit boards such that each said housing is disposed a spaced distance from at least one electrical contact of said conductive layer of said respective individual camera module circuit board; and said step of mounting said respective one of said image capture devices onto each of said individual camera module circuit boards includes coupling said respective one of said image capture devices to said at least one electrical contact of said conductive layer of said respective one of said individual camera module circuit boards.

\* \* \* \* \*